United States Patent
Mochizuki (10) Patent No.: US 8,648,329 B2
(45) Date of Patent: *Feb. 11, 2014

(54) LIGHT-EMITTING DEVICE AND PROJECTOR

(75) Inventor: Masamitsu Mochizuki, Suwa (JP)

(73) Assignee: Seiko Epson Corporation (JP)

( * ) Notice: Subject to any disclaimer, the term of this patent is extended or adjusted under 35 U.S.C. 154(b) by 229 days.

This patent is subject to a terminal disclaimer.

(21) Appl. No.: 13/116,420

(22) Filed: May 26, 2011

(65) Prior Publication Data

US 2011/0303892 A1    Dec. 15, 2011

(30) Foreign Application Priority Data

Jun. 11, 2010 (JP) .................................. 2010-133680

(51) Int. Cl.
    *H01L 29/06* (2006.01)
(52) U.S. Cl.
    USPC .................................. 257/13; 257/76; 257/98
(58) Field of Classification Search
    USPC .............................................. 257/13, 76, 98
    See application file for complete search history.

(56) References Cited

U.S. PATENT DOCUMENTS

| | | |
|---|---|---|
| 2006/0050752 A1 | 3/2006 | Nunoya et al. |
| 2007/0223856 A1 | 9/2007 | Nunoya et al. |
| 2007/0223857 A1 | 9/2007 | Nunoya et al. |
| 2008/0285609 A1 * | 11/2008 | Ohta et al. ............... 372/44.011 |
| 2012/0001210 A1 * | 1/2012 | Mochizuki ...................... 257/96 |

FOREIGN PATENT DOCUMENTS

| | | |
|---|---|---|
| CN | 1701478 A | 11/2005 |
| JP | 2008-169060 | 7/2008 |
| JP | 2009-170658 A | 7/2009 |

* cited by examiner

*Primary Examiner* — Douglas Menz
(74) *Attorney, Agent, or Firm* — Harness, Dickey & Pierce, P.L.C.

(57) ABSTRACT

A light-emitting device includes a first layer, a second layer, and a semiconductor body interposed between the first and second layers, wherein the semiconductor body has a first fine-wall-shape member, a second fine-wall-shape member, and a semiconductor member interposed between the first and second fine-wall-shape members, the first and second fine-wall-shape members have a third layer, a fourth layer, and a fifth layer interposed between the third and fourth layers, the fifth layer is a layer that generates light and guides the light, the third and fourth layers are layers that guide the light generated in the fifth layer, and the first and second layers are layers that suppress leakage of the light generated in the fifth layer.

20 Claims, 6 Drawing Sheets

LIGHT-EMITTING DEVICE AND PROJECTOR

BACKGROUND

1. Technical Field

The present invention relates to a light-emitting device and a projector.

2. Related Art

There is known a light-emitting device obtained by forming a light-emitting layer made of a group-III nitride semiconductor on a substrate, injecting a current from an external portion, and combining electrons and holes inside the light-emitting layer so as to emit light. In such a light-emitting device, a strain may be generated between a light-emitting layer and a substrate. Particularly, when InGaN is used in the light-emitting layer and materials other than InGaN (for example, GaN) are used in the substrate, lattice mismatch therebetween is generated and the strain increases. When such the strain is generated, an electric field due to a piezoelectric effect (piezoelectric field) is applied to the light-emitting layer, and a radiative recombination probability between electrons and holes is noticeably reduced.

In order to address the aforementioned problem, for example, there has been proposed a method for relaxing a strain generated between the light-emitting layer and the substrate by forming the group-III nitride semiconductor using a fine columnar crystal structure as disclosed in JP-A-2008-169060.

However, according to the technique disclosed in JP-A-2008-169060, a side surface of a fine columnar crystal structure is exposed. Therefore, non-radiative recombination caused by an impurity or a defect near the side surface occurs, and light-emitting efficiency may be degraded.

SUMMARY

An advantage of some aspect of the invention is to provide a light-emitting device having high light-emitting efficiency. In addition, another advantage of some aspect of the invention is to provide a projector having the light-emitting device described above.

According to an aspect of the invention, there is provided a light-emitting device including: a first layer having a first surface; a second layer having a second surface that faces the first surface; and a semiconductor body interposed between the first and second surfaces, wherein the semiconductor body has a first fine-wall-shape member, a second fine-wall-shape member, and a semiconductor member, the first and second fine-wall-shape members having a third layer adjacent to the first surface, a fourth layer adjacent to the second surface, and a fifth layer interposed between the third and fourth layers, the semiconductor member is interposed between the first and second fine-wall-shape members, the first and second layers are made of GaN, the third, fourth, and fifth layers and the semiconductor member are made of $In_xGa_{1-x}N$ (0<x<1), a value x of the fifth layer is larger than values x of the third and fourth layers and the semiconductor member, the fifth layer is a layer that generates light and guides the light, the third and fourth layers are layers that guide the light generated in the fifth layer, and the first and second layers are layers that suppress leakage of the light generated in the fifth layer.

In this light-emitting device, the semiconductor member is formed between the first and second fine-wall-shape members. For this reason, it is possible to suppress a non-radiative recombination in the side surface of the first and second fine-wall-shape members. Therefore, in this light-emitting device, it is possible to obtain high light-emitting efficiency while a distortion generated between the substrate and the semiconductor body is relaxed. On the other hand, if such a semiconductor member is not provided, and the side surface of the fine-wall-shape member is exposed, non-radiative recombination may occur due to an impurity or a defect in the vicinity of the side surface, and the light-emitting efficiency may be degraded.

Furthermore, in this light-emitting device, the semiconductor member is made of InGaN, and the first and second fine-wall-shape members are made of, for example, InGaN. For this reason, in comparison with a case where an insulation member made of, for example, silicon oxide or polyimide is formed between the first and second fine-wall-shape members, it is possible to make a thermal expansion coefficient of the first and second fine-wall-shape members and the semiconductor member close to each other. Therefore, in this light-emitting device, for example, when heat is generated by a current injection, it is possible to reduce the stress applied to the semiconductor body due to thermal expansion, and suppress degradation of the light-emitting efficiency caused by the stress or reduction of lifespan.

According to another aspect of the invention, there is provided a light-emitting device including: a first layer having a first surface; a second layer having a second surface that faces the first surface; and a semiconductor body interposed between the first and second surfaces, wherein the semiconductor body has a first fine-wall-shape member, a second fine-wall-shape member, and a semiconductor member, the first and second fine-wall-shape members having a third layer adjacent to the first surface, a fourth layer adjacent to the second surface, and a fifth layer interposed between the third and fourth layers, the semiconductor member is interposed between the first and second fine-wall-shape members, the first and second layers are made of AlGaN, the third and fourth layers are made of GaN, the fifth layer and the semiconductor member are made of $In_xGa_{1-x}N$ (0<x<1), a value x of the fifth layer is larger than a value x of the semiconductor member, the fifth layer is a layer that generates light and guides the light, the third and fourth layers are layers that guide the light generated in the fifth layer, and the first and second layers are layers that suppress leakage of the light generated in the fifth layer.

In this light-emitting device, similarly, it is possible to obtain high light-emitting efficiency.

In the light-emitting device according to the aspect of the invention, it is preferable that the semiconductor member is formed on the opposite side of the first fine-wall-shape member to the second fine-wall-shape member and the opposite side of the second fine-wall-shape member to the first fine-wall-shape member.

In this light-emitting device, it is possible to suppress a non-radiative recombination on the side surfaces of the first and second fine-wall-shape members and to obtain higher light-emitting efficiency.

It is preferable that the light-emitting device according to an aspect of the invention may further include a sixth layer formed to cover an output surface for outputting the light generated in the fifth layer, wherein the sixth layer is a layer that suppresses reflection of the light generated in the fifth layer, a difference of an effective refractive index between the first fine-wall-shape member and the semiconductor member is equal to or smaller than 0.01, and a difference of an effective refractive index between the second fine-wall-shape member and the semiconductor member is equal to or smaller than 0.01.

In this light-emitting device, the anti-reflection layer may be formed to cover the first and second end surfaces. As a result, it is possible to reduce reflectance on the end surface serving as an output surface. For this reason, it is possible to avoid multiple reflection of the light between the end surfaces. As a result, it is possible to suppress laser oscillation between the end surfaces. Furthermore, in this light-emitting device, a difference of the effective refractive index between the first and second fine-wall-shape members and the semiconductor member may be equal to or smaller than 0.01. Although described below in detail, as a result, it is possible to suppress the light generated in the active layer from being reflected at the interface between the first fine-wall-shape member and the semiconductor member and the interface between the second fine-wall-shape member and the semiconductor member. Therefore, it is possible to avoid multiple reflection of the light at the interface between the first fine-wall-shape member and the semiconductor member and the interface between the second fine-wall-shape member and the semiconductor member. As a result, it is possible to suppress laser oscillation.

In the light-emitting device according to the aspect of the invention, an effective refractive index of the first fine-wall-shape member is equal to that of the semiconductor member, and an effective refractive index of the second fine-wall-shape member is equal to that of the semiconductor member.

In this light-emitting device, it is possible to reliably suppress laser oscillation.

In the light-emitting device according to the aspect of the invention, it is preferable that a value x of the fifth layer is equal to or larger than 0.4 and equal to or smaller than 0.6.

In this light-emitting device, it is possible to output green light.

In the light-emitting device according to the aspect of the invention, it is preferable that the semiconductor body has a third surface connecting the first and second surfaces and a fourth surface connecting the first and second surfaces and facing the third surface, a part of the semiconductor body configures a waveguide, and the waveguide is arranged to intersect with the first and second fine-wall-shape members and extend from the third surface to the fourth surface as seen in a plan view from a normal direction of the first surface.

In this light-emitting device, it is possible to obtain high light-emitting efficiency.

It is preferable that the light-emitting device according to the aspect of the invention may further include a first electrode electrically connected to the first layer; a second electrode electrically connected to the second layer; and a seventh layer formed between the second layer and the second electrode, wherein the semiconductor body has a third surface connecting the first and second surfaces and a fourth surface connecting the first and second surfaces and facing the third surface, the seventh layer makes ohmic contact with the second electrode, and a contact surface between the seventh layer and the second electrode is arranged to intersect with the first and second fine-wall-shape members and extend from the third surface to the fourth surface as seen in a plan view from a normal direction of the first surface.

In this light-emitting device, it is possible to reduce a contact resistance of the second electrode using the seventh layer.

In the light-emitting device according to the aspect of the invention, it is preferable that the third layer may be doped with a first conductivity type, the fourth layer may be doped with a second conductivity type, and the semiconductor member may be undoped.

In this light-emitting device, the injection carriers (electrons and holes) can flow into the fine-wall-shape members avoiding the semiconductor member.

It is preferable that the light-emitting device may be a super-luminescent diode.

In this light-emitting device, it is possible to suppress laser oscillation and reduce speckle noise when it is used in an image projection apparatus such as a projector or a light source of an image display apparatus.

According to still another aspect of the invention, there is provided a projector including: the light-emitting device; an optical modulator that modulates the light output from the light-emitting device based on image information; and a projection device that projects an image formed by the optical modulator.

In this projector, it is possible to obtain high conversion efficiency of light from electricity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described with reference to the accompanying drawings.

1. Light-Emitting Device

Figure 1:
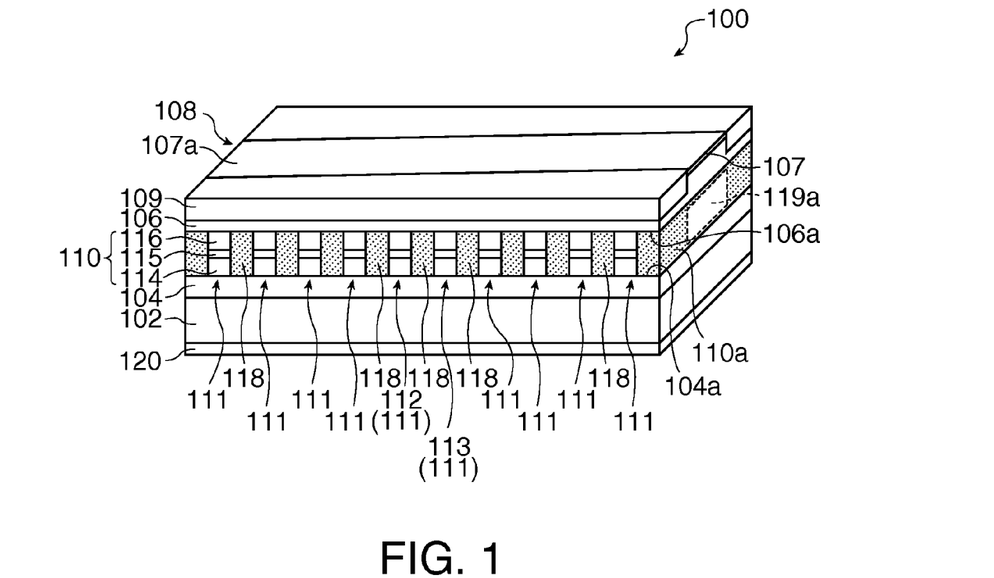
FIG. 1 is a perspective view schematically illustrating a light-emitting device according to an embodiment of the invention.
Figure 2:
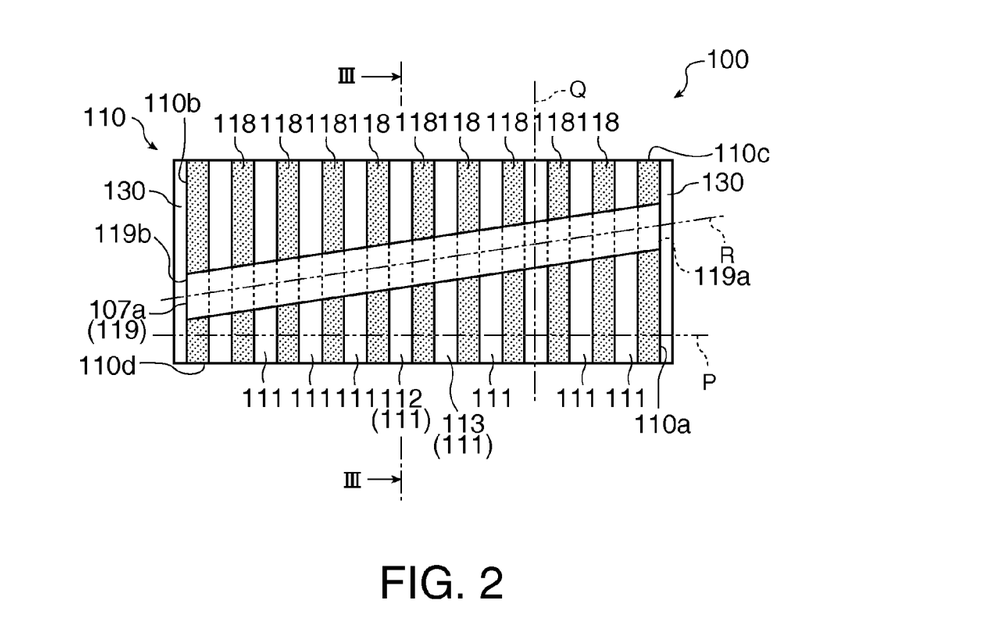
FIG. 2 is a plan view schematically illustrating the light-emitting device according to the embodiment of the invention.
Figure 3:
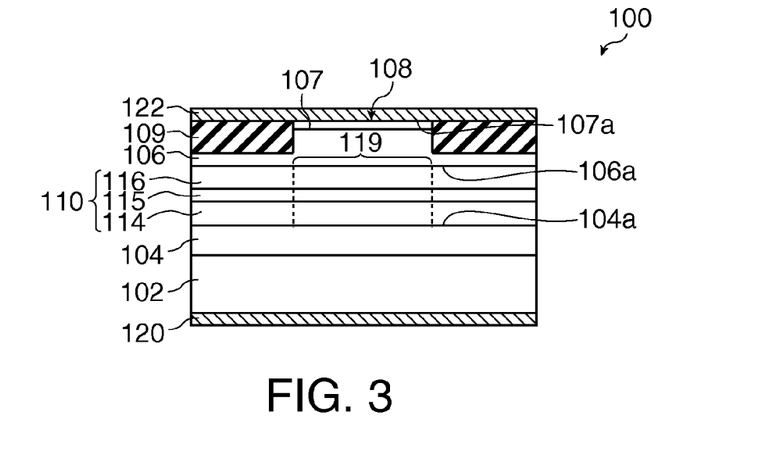
FIG. 3 is a cross-sectional view schematically illustrating the light-emitting device according to the embodiment of the invention.

First, a light-emitting device according to an embodiment of the invention will be described with reference to the accompanying drawings. FIG. 1 is a perspective view schematically illustrating a light-emitting device 100 according to an embodiment of the invention. FIG. 2 is a plan view schematically illustrating the light-emitting device 100 according to the embodiment of the invention. FIG. 3 is a cross-sectional view taken along the line of FIG. 2 for schematically illustrating the light-emitting device 100 according to the embodiment of the invention. In addition, in FIG. 1, a second electrode 122 and a sixth layer 130 are omitted for the sake of convenience. In addition, in FIG. 2, a second layer 106, an insulating portion 109, and a second electrode 122 are omitted for the sake of convenience.

As an example, a case where a super luminescent diode (hereinafter, referred to as an SLD) is used as a light-emitting device 100 will now be described. The SLD can suppress laser oscillation by suppressing the formation of a resonator unlike a semiconductor laser. For this reason, it is possible to reduce speckle noise when the SLD is used in an image projection apparatus such as a projector or a light source of an image display apparatus.

As shown in FIGS. 1 to 3, the light-emitting device 100 includes a first layer 104 (hereinafter, referred to as a "first cladding layer 104"), a second layer 106 (hereinafter, referred to as a "second cladding layer 106"), and a semiconductor body 110. Further, the light-emitting device 100 may include a substrate 102, a sixth layer 130 (hereinafter, referred to as an "anti-reflection layer" 130), a seventh layer 107 (hereinafter, referred to as a "contact layer 107"), an insulation member 109, a first electrode 120, and a second electrode 122.

As the substrate 102, for example, a first conductivity type (e.g., n-type) GaN substrate or a GaN template substrate obtained by forming an n-type GaN layer on a sapphire substrate may be used.

The first cladding layer 104 is formed on the substrate 102. As the first cladding layer 104, for example, an n-type GaN layer may be used. In addition, although not shown in the drawings, a buffer layer may be formed between the substrate 102 and the first cladding layer 104. As the buffer layer, for example, an n-type GaN layer may be used. The buffer layer may improve crystal quality of an overlying layer.

The semiconductor body 110 is formed on the first cladding layer 104. The second cladding layer 106 is formed on the semiconductor body 110. For this reason, it can be said that the semiconductor body 110 is interposed between a first surface 104a (hereinafter, referred to as an upper surface 104a) of the first cladding layer 104 and a second surface 106a (hereinafter, referred to as a lower surface 106a) of the second cladding layer 106 facing the upper surface 104a.

The semiconductor body 110 has a rectangular shape (including a cube). As shown in FIG. 2, the semiconductor body 110 may include a third surface (hereinafter, referred to as a first side surface 110a) and a fourth surface (hereinafter, referred to as a second side surface 110b) opposite to each other, and third and fourth side surfaces 110c and 110d that connect the first and second side surfaces 110a and 110b, respectively, and are opposite to each other. As shown in FIG. 1, it can be said that the first side surface 110a is a surface connecting the upper and lower surfaces 104a and 106a. Similarly, it can be said that the side surfaces 110b, 110c, and 110d of the semiconductor body 110 are a surface connecting the upper surface 104a of the first cladding layer 104 and the lower surface 106a of the second cladding layer 106.

In addition, it can be said that the normal line P of the first side surface 110a of the semiconductor body 110 intersects with the normal line (not shown) of the upper surface 104a of the first cladding layer 104. Similarly, it can be said that the normal lines (not shown) of the side surfaces 110b, 110c, and 110d of the semiconductor body 110 intersect with the normal line of the upper surface 104a of the first cladding layer 104.

The semiconductor body 110 includes a fine-wall-shape member 111 and a semiconductor member 118. The fine-wall-shape member 111 is formed on the first cladding layer 104. A plurality of the fine-wall-shape member 111 may be formed, and the number of the fine-wall-shape members 111 is not particularly limited. In the example of FIG. 1, the fine-wall-shape member 111 has a wall-like shape (plate shape) erecting with respect to the upper surface 104a of the first cladding layer 104. As shown in FIG. 2, the fine-wall-shape members 111 are arranged to extend from the third side surface 110c to the fourth side surface 110d as the light-emitting device 100 is seen from the normal direction of the upper surface 104a (as seen in a plan view). In the example of FIG. 2, the fine-wall-shape member 111 has a rectangular plane shape, and is provided in parallel with the normal line Q of the third side surface 110c to extend from the third side surface 110c to the fourth side surface 110d. Although not shown in the drawings, the fine-wall-shape member 111 may have a parallelogram plane shape, and may be inclined against the normal line Q and extend from the third side surface 110c to the fourth side surface 110d. In addition, while a plurality of the fine-wall-shape members 111 have the same planar shape in the example of FIG. 2, they may have different shapes.

The length of the longer side (for example, the length of the side in a direction of the normal line Q) or the height (for example, the length in the direction orthogonal to the normal lines P and Q) of the fine-wall-shape member 111 is not particularly limited, as long as the length of the shorter side of the fine-wall-shape member 111 (for example, the length of the side in a direction of the normal line P) is equal to or smaller than several hundreds of nanometers. However, as the lengths of the shorter and longer sides of the fine-wall-shape member are reduced, the effect of relaxation of a strain applied to the semiconductor body 110 becomes significant. Particularly, the length of the shorter side is preferably set to be equal to or smaller than 250 nm. In this manner, since the length of the shorter side of the fine-wall-shape member 111 has a nanometer scale, the fine-wall-shape members 111 may be referred to as a "nano-wall 111." When the fine-wall-shape member 111 has a hexagonal crystal system, the direction of the longer side of the fine-wall-shape member 111 may be an a-axis direction of the hexagonal crystal system.

As shown in FIGS. 1 and 3, the fine-wall-shape member 111 includes a third layer 114 (hereinafter, referred to as a "first guiding layer 114"), a fourth layer 116 (hereinafter, referred to as a "second guiding layer 116"), and an active layer 115 having a fifth layer (hereinafter, referred to as a "quantum well layer").

The first guiding layer 114 is formed on the first cladding layer 104. It can be said that the first guiding layer 114 is adjacent to the upper surface 104a of the first cladding layer 104. The first guiding layer 114 may be formed, for example, using an n-type InGaN layer.

The active layer 115 is formed on the first guiding layer 114. It can be said that the active layer 115 is interposed between the first and second guiding layers 114 and 116. The active layer 106 has a multiple quantum well (MQW) structure obtained by laminating three quantum well structures, for example, including a quantum well layer and barrier layer. The quantum well layer is made of, for example, $In_{0.5}Ga_{0.5}N$, and the barrier layer is made of, for example, $In_{0.15}Ga_{0.85}N$. The thicknesses of the quantum well layer and the barrier layer are set to be, for example, from several nanometers to 10 nm.

The second guiding layer 116 is formed on the active layer 115. It can be said that the second guiding layer 116 is adjacent to the lower surface 106a of the second cladding layer 106. As the second guiding layer 116, for example, an InGaN layer of the second conductivity type (for example, p-type) may be used. The thicknesses of the first and second guiding layers 114 and 116 are larger than that of the quantum well layer and the barrier layer, and are set to be, for example, several tens of nanometers to several hundreds of nanometers.

The semiconductor member 118 is formed on the first cladding layer 104. In the example of FIG. 2, the semiconductor member 118 has same planer shape (rectangular) as that of the fine-wall-shape member 111. However, the invention is not particularly limited thereto, and, for example, a parallelogram shape may be used. In addition, although a plurality of the semiconductor members 118 has the same planar shape in the example of FIG. 2, they may be different from each other.

The fine-wall-shape member 111 and the semiconductor member 118 are alternately arranged from the first side surface 110a to the second side surface 110b as shown in FIG. 2. That is, out of a plurality of fine-wall-shape members 111, the semiconductor member 118 is formed between the neighboring first and second fine-wall-shape members 112 and 113. Furthermore, the semiconductor member 118 is also arranged in the opposite side of the first fine-wall-shape member 112 to the second fine-wall-shape member 113 (on the side toward the second side surface 110b) and the opposite side of the second fine-wall-shape member 113 to the first fine-wall-shape member 112 (on the side toward the first side surface 110a). For example, the neighboring fine-wall-shape member 111 and the semiconductor member 118 have contact with each other. The fine-wall-shape member 111 and the semiconductor member 118 may be arranged with a constant pitch. It can also be said that the semiconductor member 118 is formed to bury gaps between a plurality of fine-wall-shape member 111. It can also be said that a remaining area of the semiconductor body 110 except for the fine-wall-shape member 111 is occupied by the semiconductor member 118.

The semiconductor member 118 may be, for example, undoped InGaN. Since the semiconductor member 118 is undoped, and the first and second guiding layers 114 and 116 of the fine-wall-shape member 111 are doped as described above, the injection carriers (electrons and holes) can flow into the fine-wall-shape member 111 avoiding the semiconductor member 118.

Part of the active layer 115, part of the guiding layers 114 and 116, and part of the semiconductor member 118 may constitute a wave guiding 119 as shown in FIGS. 2 and 3. The active layer (quantum well layer) 115 can emit light, and this light can propagate through the waveguide 119. As shown in FIG. 2, the waveguide 119 may be arranged to intersect with the first and second fine-wall-shape members 112 and 113 to extend from the first side surface 110a to the second side surface 110b as seen in a plan view. It can also be said that a virtual straight line R connecting the center of the first end surface 119a of the waveguide 119 provided on the first side surface 110a and the center of the second end surface 119b of the waveguide 119 provided on the second side surface 110b intersects with the first and second fine-wall-shape members 112 and 113.

In the example of FIG. 2, the waveguide 119 is provided inclined against the normal line P from the first side surface 110a to the second side surface 110b. It is possible to avoid multiple reflection between first and second end surfaces 119a and 119b by designing the refractive index of the semiconductor member 118 as described below. As a result, it is possible to suppress laser oscillation between the first and second end surfaces 119a and 119b. In addition, a plurality of waveguides 119 may be provided although not shown in the drawings. The waveguide 119 may be formed by a difference of the effective refractive index in a planar direction (for example, perpendicular to the thickness direction of the active layer 115) based on the planar shape of the columnar portion 108 as described below. In addition, the waveguide 119 may be formed by determining a current path based on a planar shape of a contact surface 107a of the contact layer 107 having contact with the second electrode 122 as described below.

The anti-reflection layer 130 may be formed to cover at least one of the first and second end surfaces 119a and 119b of the waveguide 119. The anti-reflection layer 130 may be formed to cover the entire area of the first and second side surfaces 110a and 110b of the semiconductor body 110. It is possible to suppress reflection of light generated in the active layer 115 using the anti-reflection layer 130. That is, it is possible to reduce the reflectance on the end surfaces 119a and 119b to 0% or a value close to 0% using the anti-reflection layer 130. As a result, it is possible effectively output light from the end surfaces 119a and 119b (also, referred to as output surfaces 119a and 119b).

While the anti-reflection layer 130 covers both the first and second end surfaces 119a and 119b in the example of FIG. 2, the anti-reflection layer 130 may cover only the first end surface 119a and the second end surface 119b may be covered by a high reflection layer. As a result, part of the light generated in the active layer 115 is reflected by the second end surface 119b and then output from the first end surface 119a. The anti-reflection layer 130 and the high reflection layer may be composed of, for example, an $Al_2O_3$ layer, a TiN layer, a $TiO_2$ layer, an SiON layer, an SiN layer, a $SiO_2$ layer, a $Ta_2O_3$ layer, a multilayered film thereof, or the like.

The second cladding layer 106 is formed on the semiconductor body 110. As the second cladding layer 106, for example, a p-type GaN layer may be used.

For example, a pin diode is composed by using a p-type second cladding layer 106, an impurity-undoped active layer 115, and an n-type first cladding layer 104.

As described above, the cladding layers 104 and 106 may be made of GaN, and the active layer 115, the guiding layers 114 and 116, and the semiconductor member 118 may be made of $In_xGa_{1-x}N$ (0<x<1). As a result, the cladding layers 104 and 106 may be made of a layer having a forbidden bandgap larger than those of the active layer 115, the guiding layers 114 and 116, and the semiconductor member 118 and a refractive index smaller than those of the active layer 115, the guiding layers 114 and 116, and the semiconductor member 118. Furthermore, it is possible to increase the value x (the value of In against Ga) of the quantum well layer included in the active layer 115 to be larger than that of the guiding layers 114 and 116. As a result, it is possible to provide the guiding layers 114 and 116 having a forbidden bandgap larger than that of the quantum well layer and a refractive index smaller than that of the quantum well layer. Moreover, it is preferable that the value x of the semiconductor member 118 is larger than those of the guiding layers 114 and 116 and smaller than that of the quantum well layer 115. As a result, it is possible to suppress the light generated in the active layer 115 from being absorbed in the semiconductor member 118.

In addition, the active layer 115 can generate green light when the quantum well layer is made of $In_xGa_{1-x}N$ (0.4≤x≤0.6). Therefore, the light-emitting device 100 can output green light.

In addition, as long as a relationship of the refractive index between each layer is maintained, a subcomponent such as Al may be mixed in each layer 104, 106, 114, and 116 containing the aforementioned composition as a main component. That is, the cladding layers 104 and 106 may be made of AlGaN, and the guiding layers 114 and 116 may be made of InAlGaN. In addition, as long as a relationship of the refractive index between each layer is maintained, the cladding layers 104 and 106 may be made of AlGaN, and the guiding layers 114 and 116 may be made of GaN. In addition, for example, the cladding layers 104 and 106 may have a super-lattice structure containing the AlGaN layer and the GaN layer, and the guiding layers 114 and 116 may be made of GaN or InGaN.

Using the aforementioned composition of each layer, the active layer 115 (quantum well layer) can generate light and has a function of amplifying the light. The active layer 115 also has a function of guiding the light. The guiding layers 114 and 116 have a function of guiding the light generated in the active layer 115. The cladding layers 104 and 106 have a function of suppressing leakage of the injection carriers (electrons and holes) and the light. The semiconductor member 118 also has a function of guiding light, but is different from the guiding layers 114 and 116 in that the injection carriers flow avoiding the semiconductor member 118.

More specifically, in the light-emitting device 100, when a forward bias voltage of a pin diode is applied between the first and second electrodes 120 and 122, electrons and holes are injected to the active layer 115 by way of the guiding layers 114 and 116 avoiding the semiconductor member 118, and a recombination between electrons and holes occurs in a portion of the active layer 115 included in the waveguide 119. This recombination generates light. Originating from the generated light stimulus, emission occurs in a chain manner so that the intensity of light inside the active layer 115 of the waveguide 119 is amplified. For example, part of the light generated in the active layer 115 of the waveguide 119 may alternately pass through the fine-wall-shape member 111 and the semiconductor member 118 included in the waveguide 119 and be output from the first end surface 119a as the output light. Similarly, a part of the light generated in the active layer 115 of the waveguide 119 may alternately pass through the fine-wall-shape member 111 and the semiconductor member 118 of the waveguide 119 and be output from the second end surface 119b as the output light. While the end surfaces 119a and 119b are provided in the semiconductor member 118 in the example of FIGS. 1 and 2, it may be provided in the fine-wall-shape member 111.

A difference between the effective refractive index of the fine-wall-shape member 111 (the effective refractive index of the vertical cross section including in the fine-wall-shape member 111) and the effective refractive index of the semiconductor member 118 (the effective refractive index of the vertical cross-section including the semiconductor member 118) is preferably equal to or smaller than 0.01. That is, a difference between the effective refractive index of the first fine-wall-shape member 112 and the effective refractive index of the semiconductor member 118 is preferably equal to or smaller than 0.01, and a difference between the effective refractive index of the second fine-wall-shape member 113 and the effective refractive index of the semiconductor member 118 is preferably equal to or smaller than 0.01. As will be described below in detail, as a result, it is possible to prevent the light generated in the active layer 115 from being reflected at the interface between the semiconductor member 118 and the fine-wall-shape member 111 of, the waveguide 119. Therefore, for example, it is possible to suppress multiple reflection at the interface between the first fine-wall-shape member 112 and the semiconductor member 118 and the interface between the second fine-wall-shape member 113 and the semiconductor member 118. As a result, it is possible to suppress laser oscillation at the interface between the fine-wall-shape member 111 and the semiconductor member 118.

A effective refractive index n can be expressed as the following equation (1):

$$n = \left[\int_{-\infty}^{\infty} n(z)|E(z)|^2 dz\right] / \left[\int_{-\infty}^{\infty} |E(z)|^2 dz\right] \quad (1)$$

where, E denotes an electric field, and Z denotes a thickness direction of the active layer 115 (a direction normal to the first cladding layer 104).

The contact layer 107 is formed on the second cladding layer 106 as shown in FIGS. 1 and 3. As the contact layer 107, for example, a p-type GaN layer may be used. The contact layer 107 may make ohmic contact with the second electrode 122. As a result, it is possible to reduce a contact resistance of the second electrode 122.

Although not shown in the drawings, an etch-stop layer or a carrier stopping layer may be formed in between the second cladding layer 106 and the guiding layer 116. The etch-stop layer can improve an accuracy of the depth of the ridge waveguide. The carrier stopping layer can act to reduce an effect of mobility difference between electrons and holes on the radiative recombination rate.

Part of the second cladding layer 106 and the contact layer 107 may configure the columnar portion 108. In a portion included in the columnar portion 108, the effective refractive index described above can increase in comparison with the portions other than the columnar portion 108 as described below. As a result, it is possible to form a waveguide 119 by confining light in a planar direction. That is, the plane shape of the waveguide 119 can be determined based on a plane shape of the columnar portion 108. As described below, the second electrode 122 is formed on the contact layer 107. The plane shape of the contact surface 107a of the contact layer 107 having contact with the second electrode 122 may be the same as the plane shape of the columnar portion 108, that is, the plane shape of the waveguide 119. In other words, similar to the waveguide 119, the contact surface 107a may intersect with the first and second fine-wall-shape members 112 and 113 from the first side surface 110a to the second side surface 110b as shown in FIG. 2. In addition, it is possible to prevent a current from diffusing in a planar direction as described below using the columnar portion 108 (by confining the current in a planar direction) and to determine a current path between the electrodes 120 and 122. Although not shown in the drawings, the side surface of the columnar portion 108 may be inclined.

As shown in FIGS. 1 and 3, the insulation member 109 may be disposed on the second cladding layer 106 and on the lateral side of the columnar portion 108. The insulation member 109 may have contact with the side surface of the columnar portion 108. As shown in FIG. 3, for example, the upper surface of the insulation member 109 may be continuously connected to the upper surface of the contact layer 107. The insulation member 109 may be made of, for example, SiN, $SiO_2$, polyimide, or the like. As the insulation member 109 is made of such materials, the current between electrodes 120 and 122 may flow to the columnar portion 108 interposed between the insulation members 109 avoiding the insulation member 109. The insulation member 109 may have a refractive index smaller than that of the second cladding layer 106. In this case, an effective refractive index of the vertical cross section of a portion including the insulation member 109 is smaller than that of a portion excluding the insulation member 109, that is, the portion including the columnar portion 108. As a result, it is possible to effectively confine light within the waveguide 119 in a planar direction. In addition, although not shown in the drawings, the insulation member 109 may not be provided. It may be explained that the insulation member 109 is air.

The first electrode 120 is formed on the entire bottom surface of the substrate 102. The first electrode 120 may have contact with a layer making an ohmic contact with the first electrode 120 (in the illustrated example, the substrate 102). The first electrode 120 is electrically connected to the first cladding layer 104 through the substrate 102. The first electrode 120 is one of the electrodes for driving the light-emitting device 100. For example, the first electrode 120 may be obtained by sequentially stacking a Ti layer, an Al layer, and an Au layer from the side of the substrate 102, or the like.

In addition, a second contact layer (not shown) may be provided between the first cladding layer 104 and the substrate 102, and the second contact layer may be exposed through dry etching or the like to provide a first electrode 120 on the second contact layer. As a result, it is possible to obtain a single-sided electrode structure. This structure is particularly effective in a case where a part of the substrate 102 is insulative as in the GaN template substrate obtained by growing the GaN layer on the sapphire substrate.

The second electrode 122 is formed on the contact layer 107. In addition, the second electrode 122 may be provided on the insulation member 109 as shown in FIG. 3. The second electrode 122 is electrically connected to the second cladding layer 106 through the contact layer 107. The second electrode 122 is the other electrode for driving the light-emitting device 100. For example, the second electrode 122 may be obtained by sequentially stacking a Ni layer, a Pd layer, an Au layer from the side of the contact layer 107, or the like.

The light-emitting device 100 described above may be applied, for example, to a light source of a projector, a display, an illumination apparatus, a measurement apparatus, or the like.

The light-emitting device 100 according to the embodiment of the invention has, for example, the following characteristics.

In the light-emitting device 100, the semiconductor member 118 is formed between the first and second fine-wall-shape members 112 and 113. Therefore, it is possible to suppress a non-radiative recombination on the side surfaces of the first and second fine-wall-shape members 112 and 113 included in the waveguide 119. Therefore, in the light-emitting device 100, it is possible to obtain high light-emitting efficiency while a strain between the substrate 102 and the semiconductor body 110 is relaxed. For example, when the side surface of the fine-wall-shape member is exposed, a non-radiative recombination occurs due to an impurity or a defect in the vicinity of the side surface so that the light-emitting efficiency may be degraded.

Furthermore, in the light-emitting device 100, the semiconductor member 118 is made of InGaN, and the first and second fine-wall-shape members 112 and 113 are made of, for example, InGaN. For this reason, compared to a case where an insulation member made of silicon oxide or polyimide is formed between the fine-wall-shape members 112 and 113, a thermal expansion coefficient of the fine-wall-shape members 112 and 113 and the semiconductor member 118 can be close to each other. Therefore, in the light-emitting device 100, for example, even when heat is generated by a current injection, it is possible to reduce a stress applied to the semiconductor body 110 due to thermal expansion, and it is possible to suppress the degradation of light-emitting efficiency or reduction of lifetime caused by the stress. This is similarly applied to a case where the active layer 115 is made of InGaN, and the guiding layers 114 and 116 are made of GaN.

In the light-emitting device 100, the semiconductor member 118 may also be formed on the opposite side of the first fine-wall-shape member 112 to the second fine-wall-shape member 113 (on the side toward the second side surface 110$b$) and the opposite side of the second fine-wall-shape member 113 to the first fine-wall-shape member 112 (on the side toward the first side surface 110$a$). For this reason, it is possible to more effectively suppress a non-radiative recombination in the side surface of the fine-wall-shape members 112 and 113.

In the light-emitting device 100, the anti-reflection layer 130 may be formed to cover the first and second end surfaces 119$a$ and 119$b$ of the waveguide 119. As a result, it is possible to reduce the reflectance on the end surfaces 119$a$ and 119$b$ serving as an output surface. In addition, in the light-emitting device 100, a difference of the effective refractive index between the fine-wall-shape members 112 and 113 and the semiconductor member 118 may be equal to or smaller than 0.01. Although described below in detail, as a result it is possible to prevent the light generated in the active layer 115 from being reflected at the interface between the fine-wall-shape members 112 and 113 and the semiconductor member 118. Therefore, it is possible to avoid multiple reflection of the light at the interface between the fine-wall-shape members 112 and 113 and the semiconductor member 118. As a result, it is possible to suppress laser oscillation at the interface between the fine-wall-shape members 112 and 113 and the semiconductor member 118. In addition, since it is possible to reduce the reflectance of the end surfaces 119$a$ and 119$b$, it is also possible to prevent multiple reflection of the light between the end surfaces 119$a$ and 119$b$. As a result, it is also possible to suppress laser oscillation between the end surfaces 119$a$ and 119$b$. As described above, since it is possible to suppress laser oscillation in the light-emitting device 100, the light-emitting device 100 may be a super-luminescent diode. Therefore, the light-emitting device 100 can suppress laser oscillation and reduce speckle noise when it is used as a light source in an image projection apparatus such as a projector or an image display apparatus.

In the light-emitting device 100, the quantum well layer of the active layer 115 may be made of $In_xGa_{1-x}N$ ($0.4 \leq x \leq 6$). As a result, the light-emitting device 100 can output green light.

In the light-emitting device 100, the semiconductor member 118 may be undoped, and the first and second guiding layers 114 and 116 of the fine-wall-shape member 111 may be doped. As a result, the injection carrier can flow into the fine-wall-shape member 111 avoiding the semiconductor member 118.

2. Method of Manufacturing Light-Emitting Device

Next, a method of manufacturing a light-emitting device according to an embodiment of the invention will be described with reference to the accompanying drawings. FIGS. 4 to 8 are perspective views schematically illustrating a manufacturing process of the light-emitting device 100 according to an embodiment of the invention.

Figure 4:
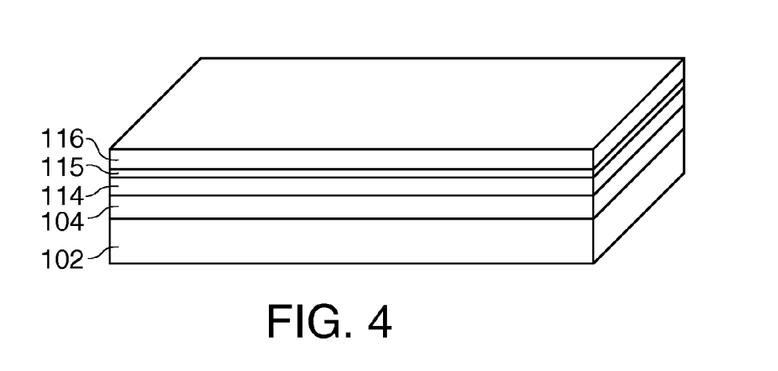
FIG. 4 is a perspective view schematically illustrating a process of manufacturing a light-emitting device according to an embodiment of the invention.

As shown in FIG. 4, the first cladding layer 104, the first guiding layer 114, the active layer 115, and the second guiding layer 116 are epitaxially grown on the substrate 102 in this order. The epitaxial growth may include, for example, a metal organic chemical vapor deposition (MOCVD) method and a molecular beam epitaxy (MBE) method.

Figure 5:
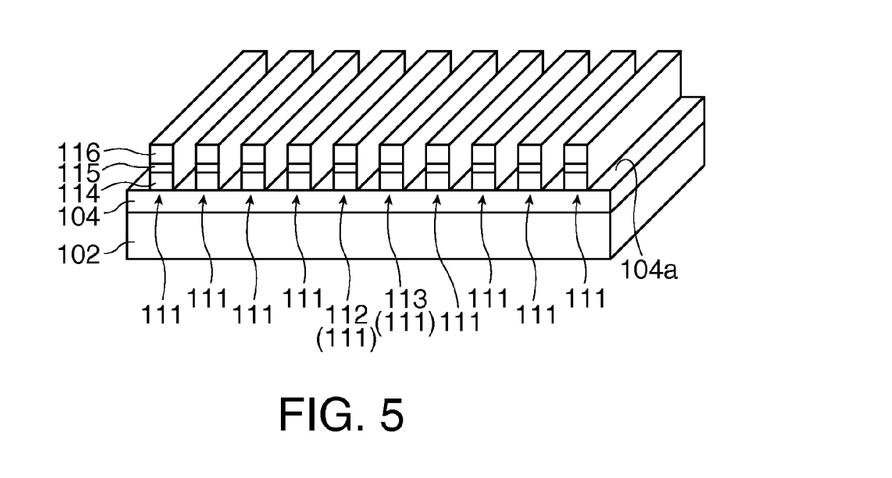
FIG. 5 is a perspective view schematically illustrating the process of manufacturing a light-emitting device according to the embodiment of the invention.

As shown in FIG. 5, the fine-wall-shape member 111 is formed by patterning the second guiding layer 116, the active layer 115, and the first guiding layer 114. The patterning may be performed, for example, using a photolithography technique and an etching technique. In the illustrated example, the patterning is performed to expose part of the upper surface 104a of the first cladding layer 104.

Figure 6:
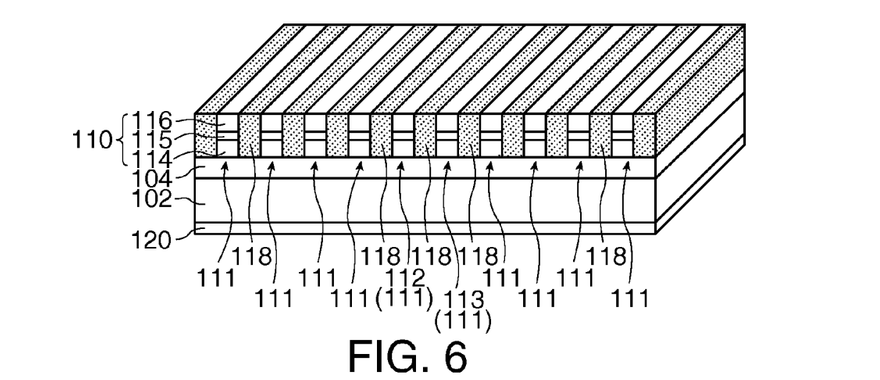
FIG. 6 is a perspective view schematically illustrating the process of manufacturing a light-emitting device according to the embodiment of the invention.

As shown in FIG. 6, the semiconductor member 118 is formed on the lateral side of the fine-wall-shape member 111 on the upper surface 104a of the exposed first cladding layer 104. As a result, it is possible to form the semiconductor body 110. The semiconductor member 118 may be formed such that the upper surface of the semiconductor member 118 is continuously connected to the upper surface of the fine-wall-shape member 111. The semiconductor member 118 is formed through an epitaxial lateral overgrowth (ELO), for example, using an MOCVD method. In the growth of InGaN included in the semiconductor member 118, the growth rate of the transverse direction (for example, a direction orthogonal to the thickness direction of the active layer 115) is significantly faster than that in the stacking direction (for example, a thickness direction of the active layer 115), which allows a gap between the fine-wall-shape members 111 to be filled relatively readily. Specifically, even when the interval between the neighboring fine-wall-shape members 111 ranges from several tens to hundreds of nanometers, it is possible to more readily fill the gap with the semiconductor member 118 without vacancy by using an ELO, in comparison with a chemical vapor deposition (CVD) method or a sputtering method. Furthermore, it is possible to improve crystal quality of the semiconductor member 118 by forming the semiconductor member 118 using an ELO.

Figure 7:
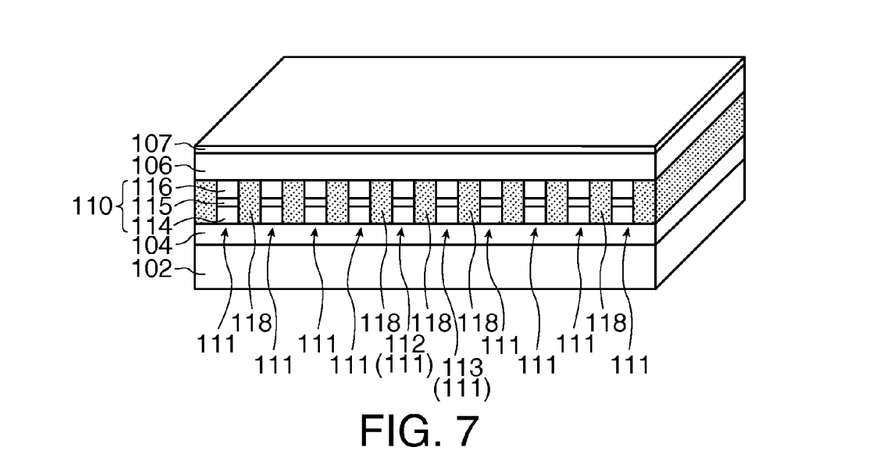
FIG. 7 is a perspective view schematically illustrating the process of manufacturing a light-emitting device according to the embodiment of the invention.

As shown in FIG. 7, the second cladding layer 106 and the contact layer 107 are epitaxially grown on the semiconductor body 110 in this order. The epitaxial growth method may include, for example, a MOCVD method and an MBE method.

Figure 8:
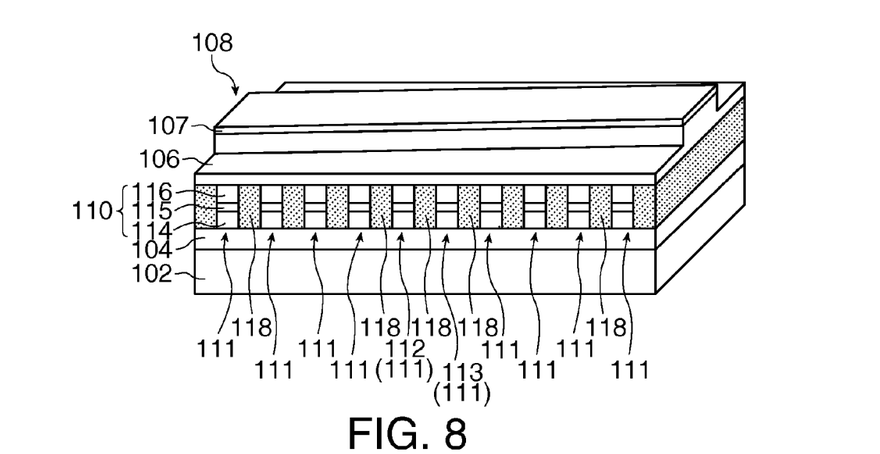
FIG. 8 is a perspective view schematically illustrating the process of manufacturing a light-emitting device according to the embodiment of the invention.

As shown in FIG. 8, at least the contact layer 107 and part of the second cladding layer 106 are patterned to form the columnar portion 108. The patterning is carried out, for example, using a photolithographic technique and an etching technique. In the illustrated example, the patterning is carried out not to expose the upper surface of the semiconductor body 110.

As shown in FIG. 1, the insulation member 109 is formed to cover the side surface of the columnar portion 108. Specifically, first, for example, the insulation layer (not shown) is formed on the upper side (including the contact layer 107) of the second cladding layer 106 using a CVD method and a doping method. Next, for example, the upper surface of the contact layer 107 is exposed using an etching technique or the like. Through the aforementioned process, it is possible to form the insulation member 109.

The second electrode 122 is formed on the contact layer 107 and the insulation member 109 as shown in FIG. 3. The second electrode 122 is formed, for example, using a vacuum deposition method.

Next, the first electrode 120 is formed on the lower surface of the substrate 102. The first electrode 120 is formed, for example, using a vacuum deposition method. The sequence of forming the first electrode 120 and the second electrode 122 is not particularly limited.

As shown in FIG. 2, the anti-reflection layer 130 is formed on the first and second side surfaces 110a and 110b of the semiconductor body 110. The anti-reflection layer 130 is formed, for example, using a CVD method, a sputtering method, an ion assisted deposition method, or the like.

Through the aforementioned process, it is possible to manufacture the light-emitting device 100.

By the aforementioned manufacturing method, it is possible to manufacture the light-emitting device 100 having high light-emitting efficiency.

3. Modified Example of Light-Emitting Device

Figure 9:
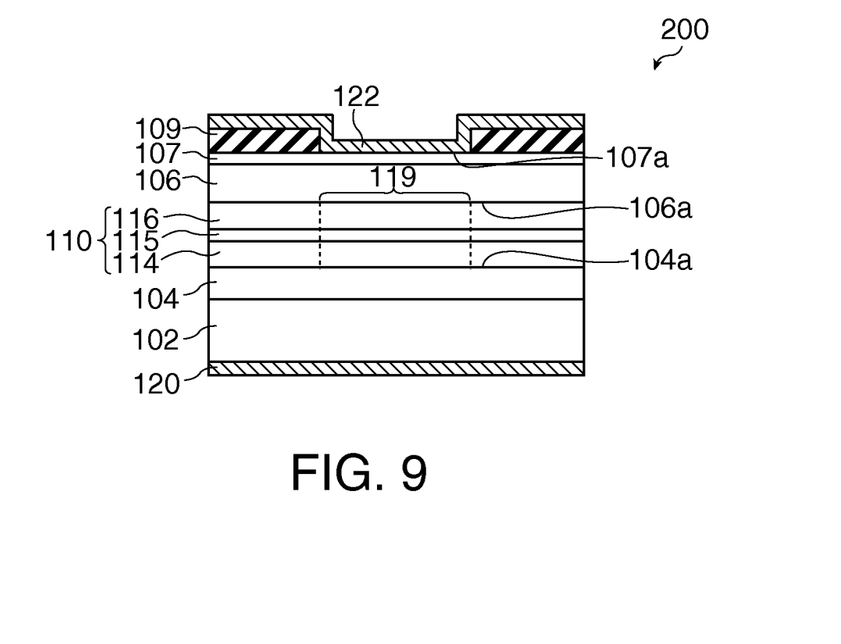
FIG. 9 is a cross-sectional view schematically illustrating a light-emitting device according to a modified example of the invention.

Next, a light-emitting device according to a modified example of the embodiment will be described with reference to the accompanying drawings. FIG. 9 is a cross-sectional view schematically illustrating a light-emitting device 200 according to a modified example of the invention, and corresponds to FIG. 3. Hereinafter, the light-emitting device 200 according to the modified example of the invention will be described with reference to the accompanying drawings, in which like reference numerals denote like elements as in the light-emitting device 100 according to the embodiment of the invention, and description thereof will not be repeated.

In the example of the light-emitting device 100, as shown in FIG. 3, an index-guiding type has been described in which a refractive index difference is provided between the area of the insulation member 109 and the area where the insulation member 109 is not provided, that is, the area of the columnar portion 108. In contrast, the light-emitting device 200 may be a gain-guiding type in which the columnar portion 108 is not formed, and a refractive index difference is not provided in the planar direction.

That is, in the light-emitting device 200, as shown in FIG. 9, the contact layer 107 and the second cladding layer 106 does not form the columnar portion, so that it is unnecessary to form the insulation member 109 on the lateral side of the columnar portion. In the light-emitting device 200, the insulation member 109 is formed on the contact layer 107 other than the upper side of the portion corresponding to the waveguide 119. That is, the insulation member 109 has an opening portion over the portion corresponding to the waveguide 119, and the upper surface of the contact layer 107 is exposed at the opening section. The second electrode 122 is formed on the exposed contact layer 107 and the insulation member 109. In the illustrated example, the planar shape of the contact surface 107a of the contact layer 107 having contact with the second electrode 122 determines the current path between the electrodes 120 and 122, and as a result, the planar shape of the waveguide 119 is determined. Therefore, the contact surface 107a has the same planar shape as that of the waveguide 119. In addition, although not shown in the drawings, it is possible that the second electrode 122 is formed only on the contact layer 107 over the waveguide 119 and is not formed on the insulation member 109.

Similar to the light-emitting device 100, the light-emitting device 200 can be used to obtain high light-emitting efficiency.

4. Experimental Example of Light-Emitting Device

Next, an experimental example of the light-emitting device according to the embodiment of the invention will be described with reference to the accompanying drawings.

Figure 10:
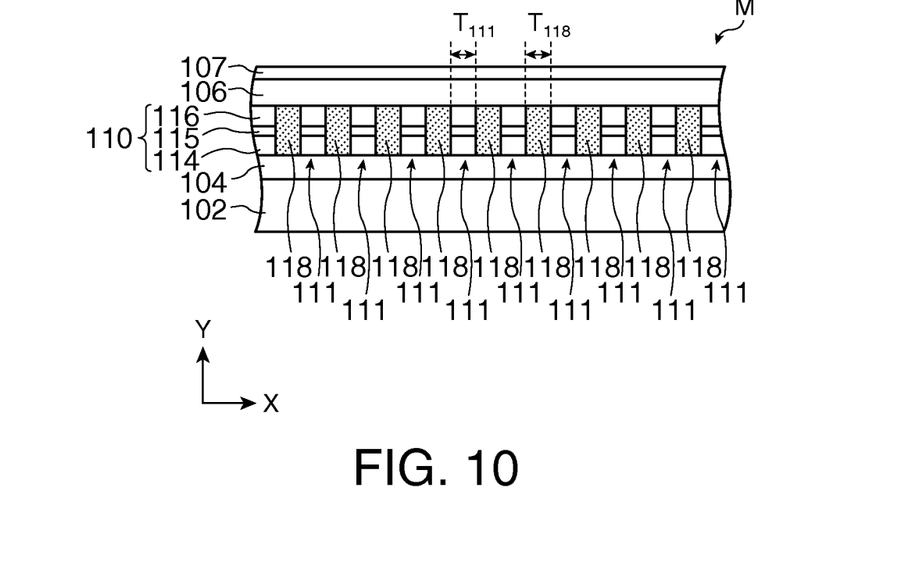
FIG. 10 is a diagram schematically illustrating a model used in an experimental example of the light-emitting device according to an embodiment of the invention.

Specifically, simulation using a model M obtained by modeling the light-emitting device 100 according to the embodiment of the invention will be described. Simulation is carried out according to a 2-dimensional finite difference time domain (FDTD) method.

4.1. Configuration of Model M

FIG. 10 is a diagram schematically illustrating a model M of the light-emitting device 100 according to the embodiment of the invention. In the model M, it is assumed that the substrate 102 is made of GaN (having a refractive index of 2.54), the first cladding layer 104 is made of GaN (having a refractive index of 2.54 and a thickness of 1000 nm), and the first guiding layer 114 is made of $In_{0.15}Ga_{0.85}N$ (having a refractive index of 3.0 and a thickness of 100 nm). It was assumed that the active layer 115 has a double quantum well (DQW) structure including an $In_{0.5}Ga_{0.5}N$ quantum well layer (having a refractive index of 3.4 and a thickness of 4.0 nm) and an $In_{0.15}Ga_{0.85}N$ barrier layer (having a refractive index of 3.0 and a thickness of 10.0 nm). It is assumed that the second guiding layer 116 is made of $In_{0.15}Ga_{0.85}N$ (having a refractive index of 3.0 and a thickness of 100 nm), the second cladding layer 106 is made of GaN (having a refractive index of 2.54 and a thickness of 1000 nm), and the contact layer 107 is made of GaN (having a refractive index of 2.54 and a thickness of 30 nm).

As shown in FIG. 10, it is assumed that the model M has the same shape as the cross-sectional shape of the light-emitting device 100 at the columnar portion parallel with the normal line P of FIG. 2. That is, as for the light-emitting device 100, it is assumed that the model M has the cross section of the portion including the columnar portion 108 perpendicular to the upper surface of the substrate and the first side surface. As for the light-emitting device 200, the model M has the same shape as any cross section perpendicular to the upper surface of the substrate and the first surface side. That is, in the model M, it can be said that the waveguide 119 of the light-emitting device 100 of FIG. 2 is assumed to extend perpendicularly to the first side surface 110a. In the model M, the cross section is not taken along the waveguide direction of the light-emitting device 100 because the possibility of laser oscillation is the highest direct multiple reflection occurs perpendicular to the direction of the longer side of the fine-wall-shape member 111.

In the model M, light is also guided by the active layer 115 and the guiding layers 114 and 116. In the model M, the fine-wall-shape members 111 having a length of $T_{111}=\lambda/(4n_{111})$ are periodically arranged in the X-axis direction. Here, $\lambda$ denotes a wavelength of the light generated in the active layer 115, $n_{111}$ denotes an effective refractive index of the fine-wall-shape member 111. The length of the X-axis direction of the model M was set to be infinite. That is, in the model M, the fine-wall-shape members 111 are periodically and infinitely arranged with a pitch of $\lambda/(4n_{111})$ in the X-axis direction. However, since the cladding layer is separately provided in the outer side of the fine-wall-shape member 111 in the model M, it is necessary to set the integral range in the equation (1) not to be from $-\infty$ to $+\infty$, but to be from the lower surface of the guiding layer 114 to the upper surface of the guiding layer 116. In addition, $n_{111}$ obtained as a result is an approximate value. In practice, $n_{111}$ is obtained based on the result of simulation, and $T_{111}$ is also modified again so that it is necessary to repeat calculation until convergence.

In the model M, the semiconductor member 118 was made of $In_xGa_{1-x}N$ (0<x<1), and an analysis was carried out by changing the effective refractive index $n_{118}$ by 0.01 by changing the value x in the semiconductor member 118. The thickness $T_{118}$ of the semiconductor member 118 was set to $T_{118}=\lambda/(4n_{118})$. Here, $n_{118}$ denotes an effective refractive index of the semiconductor member 118. In addition, an analysis was carried out under the condition that the fine-wall-shape members 111 and the semiconductor members 118 are infinitely and periodically arranged with a pitch of $T_{111}+T_{118}=\lambda/(4n_{111})+\lambda/(4n_{118})$ in the X-axis direction. More specifically, a boundary condition (Bloch's boundary condition), which light infinitely propagates through a periodical structure in the X direction, that is, in the direction of the shorter side of fine-wall-shape member 111 with a certain propagation constant while the computational area of itself has a single period, was applied to both ends of the computational area in the X direction.

In the model M, light is generated in the active layer 115 of the fine-wall-shape member 111, and a frequency component of the light propagating through or resonating within the semiconductor body 110 is analyzed. It is assumed that the generated light is not amplified in the active layer 115 for the purpose of computational simplicity.

4.2. Simulation Result

Figure 11:
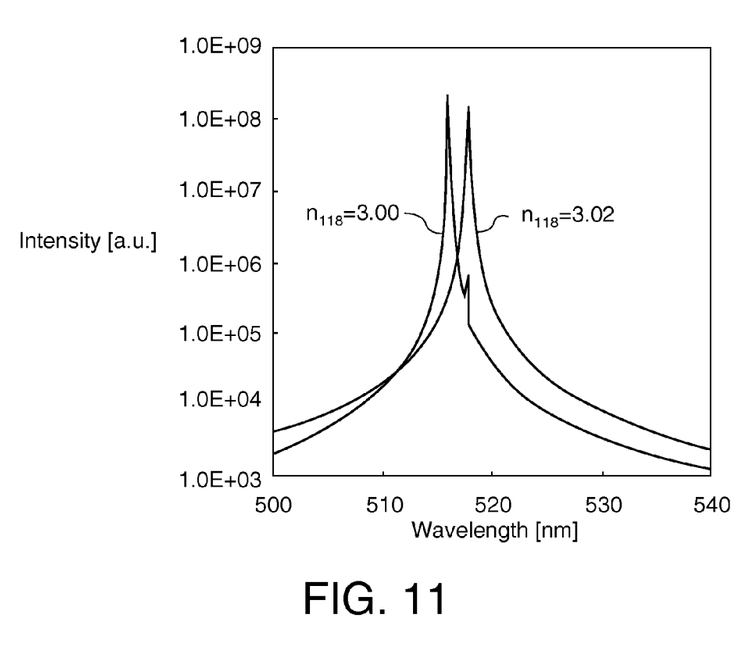
FIG. 11 is a graph illustrating a result of the experimental example of the light-emitting device according to the embodiment of the invention.
Figure 12:
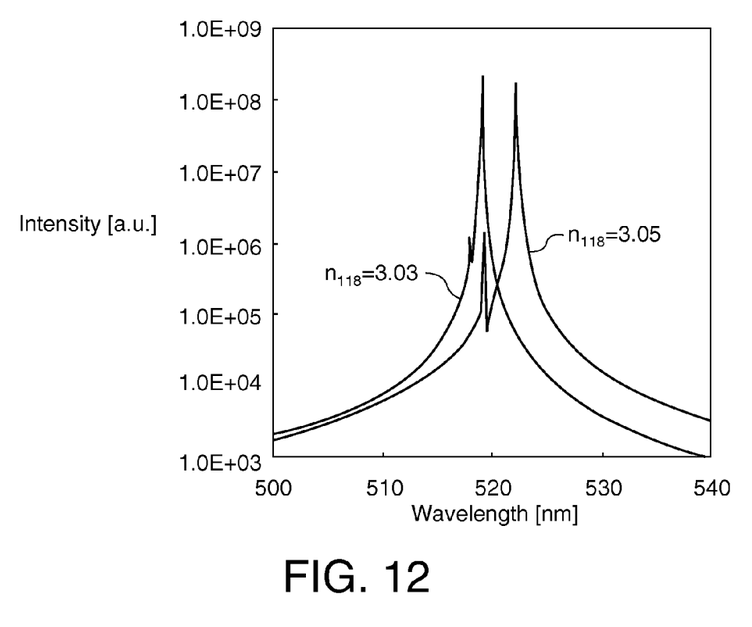
FIG. 12 is a graph illustrating a result of the experimental example of the light-emitting device according to the embodiment of the invention.

FIGS. 11 and 12 are simulation results illustrating, the wavelength spectrum of the propagating light and the resonating light when a Bragg reflection condition (a condition corresponding to the end of the Brillouin zone) is applied as a Bloch boundary condition. In a case where such a condition is applied, it is known that two resonation peaks are exhibited when a reflection band generated by multiple reflection exists. Such resonation peaks represent distributed feedback (DFB) oscillation at the interface between the fine-wall-shape member 111 and the semiconductor member 118. In addition, the wavelength region between such peaks is a reflection band. FIG. 11 illustrates a wavelength spectrum when $n_{118}$ is set to 3.00 and 3.02. FIG. 12 illustrates a wavelength spectrum when $n_{118}$ is set to 3.03 and 3.05.

Referring to FIGS. 11 and 12, it is recognized that two peaks are generated except for a case where $n_{118}$ is 3.02. As reflectance and a refractive index difference at the interface between the fine-wall-shape member 111 and the semiconductor member 118 increase, the interval between the two peaks, that is, a reflection band increases. Referring to FIG. 11, the reflection band is disappeared only when $n_{118}$ is 3.02. Therefore, in this case, it is anticipated that the effective refractive index difference $\Delta n$ is equal to or smaller than 0.01. That is, it is recognized that the effective refractive index $n_{111}$ of the fine-wall-shape member 111 is about 3.02. In other words, if the effective refractive index $n_{111}$ of the fine-wall-shape member 111 is equal to the effective refractive index $n_{118}$ of the semiconductor member 118, it can be said that it is possible to reliably prevent oscillation between the fine-wall-shape member 111 and the semiconductor member 118. In practice, the effective refractive index $n_{111}$ is calculated by carrying out such computation, and based on this, the aforementioned length $T_{111}$ is set again, and the simulation is repeatedly carried out until the value of $n_{111}$ (that is, also including the length $T_{111}$) is converged. The simulation results of FIGS. 11 and 12 illustrate the result when the value of $n_{111}$ is converged. That is, the simulation results of FIGS. 11 and 12 are obtained when the length is set to $T_{111}=\lambda/(4n_{111})=\lambda/(4\times3.02)$.

As shown in FIG. 12, when $\Delta n$ is set to 0.01 (when $n_{118}$ is set to 3.03), the interval between the two peaks, that is, the reflection band is sufficiently small, and it can be said that it is possible to sufficiently suppress oscillation at the interface between the fine-wall-shape member 111 and the semiconductor member 118. In addition, it can be said that, as $\Delta n$ increases by setting $n_{118}$ to be 3.03 or 3.05, the interval between the two peaks, that is, the reflection band increases.

Based on the aforementioned description, it is recognized that $\Delta n$ is set to be equal to or smaller than 0.01 in order to suppress oscillation in the model M.

In addition, in the model M, an infinite periodical structure is formed by setting the length of the fine-wall-shape member 111 to $T_{111}=\lambda/(4n_{111})$ and setting the length of the semiconductor member 118 to $T_{118}=\lambda/(4 n_{118})$, and the light propagating direction is set to be perpendicular to the direction of the longer side of the fine-wall-shape member 111 as described above. Oscillation can most easily occur under such a condition. Therefore, in the light-emitting devices 100 and 200, when a condition that Δn is equal to or smaller than 0.01 is satisfied, it can be said that it is possible to sufficiently suppress laser oscillation regardless of the thickness and the pitch of the fine-wall-shape member 111.

5. Projector

Figure 13:
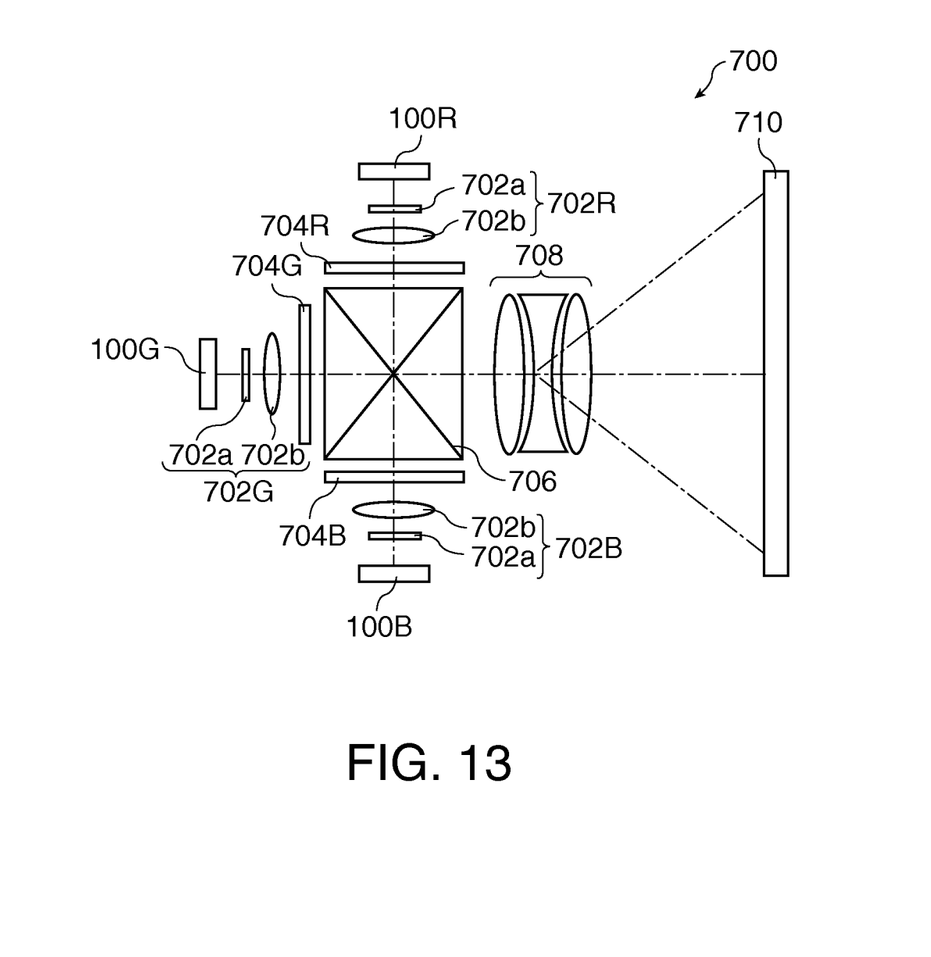
FIG. 13 is a diagram schematically illustrating a projector according to an embodiment of the invention.

Next, a projector 700 according to an embodiment of the invention will be described. FIG. 13 is a diagram schematically illustrating a projector 700. In addition, in FIG. 13, the case of the projector 700 is omitted for the purpose of simplicity. The projector 700 has the light-emitting device according to the embodiment of the invention. Hereinafter, an example in which the light-emitting device 100 is used as the light-emitting device according to the embodiment of the invention will be described.

The projector 700 may include a red light source (light-emitting device) 100R, a green light source (light-emitting device) 100G, and a blue light source (light-emitting device) 100B outputting red light, green light, and blue light, respectively. Out of these, at least the green light source 100G corresponds to the aforementioned light-emitting device 100.

The projector 700 includes transmissive liquid crystal light valves (optical modulators) 704R, 704G, and 704B for modulating respective light output from the light sources 100R, 100G, and 100B, based on image information, and a projection lens (projection device) 708 for projecting images formed by the liquid crystal light valves 704R, 704G, and 704B onto a screen (display surface) 710 by magnification. Furthermore, the projector 700 may include a cross dichroic prism (color light synthesizing unit) 706 for synthesizing the each colored light output from the liquid crystal light valves 704R, 704G, and 704B and guiding the light into the projection lens 708.

In addition, the projector 700 includes homogenizing optical systems 702R, 702G, and 702B in the downstream of the optical path from the light sources 100R, 100G, and 100B, respectively, in order to homogenize an illumination distribution of the light output from the light sources 100R, 100G, and 100B. As a result, the liquid crystal light valves 704R, 704G, and 704B are illuminated with the light of which the illumination distribution is homogenized. Each of the homogenizing optical systems 702R, 702G, and 702B is configured by, for example, a hologram 702a and a field lens 702b.

Three colored light beams modulated by the liquid crystal light valves 704R, 704G, and 704B enter the cross dichroic prism 706. The cross dichroic prism 706 is formed by bonding four rectangular prisms, and a dielectric multi-layer film for reflecting red light and a dielectric multi-layer film for reflecting blue light are arranged in a cross shape on the inner surface thereof. The three colored light beams are synthesized by such dielectric multi-layer films so as to form light representing color image. Then, the synthesized light is projected onto a screen 710 by the projection lens 706 and thus a magnified image is displayed.

The projector 700 can have a green light source 100G having high light-emitting efficiency. Accordingly, the projector 700 can also provide conversion efficiency of light from electricity as a whole.

Although a transmissive liquid crystal light valve is used as the optical modulator in the aforementioned example, light valves other than the liquid crystal light or a reflective light valve may be used. Such a light valve may include, for example, a reflective liquid crystal light valve or a digital micro mirror device. In addition, the configuration of the projection optical system can be appropriately modified according to the type of the light valve used.

In addition, the light sources 100R, 100G, and 100B can be used as the light source of a scanning type image display apparatus (projector) which has a scanning unit as an image forming device for displaying an image with a desired size on a display surface by scanning light from the light source onto the screen.

The aforementioned embodiments and the modified examples are just exemplary and not intended to limit the invention. For example, each embodiment and each modified example may be combined in an appropriate form.

Although embodiments of the invention have been described in detail above, it would be readily appreciated by those skilled in the art that they may be variously modified without substantially departing from the novel concepts and effects. Therefore, it is intended that such modified examples are included within the scope of the invention.

The entire disclosure of Japanese Patent Application No. 2010-133680, filed Jun. 11, 2010 is expressly incorporated by reference herein.

What is claimed is:

1. A light-emitting device comprising:
a first layer having a first surface;
a second layer having a second surface that faces the first surface; and
a semiconductor body interposed between the first and second surfaces,
wherein the semiconductor body has a first fine-wall-shape member, a second fine-wall-shape member, and a semiconductor member,
the first and second fine-wall-shape members having
a third layer adjacent to the first surface;
a fourth layer adjacent to the second surface; and
a fifth layer interposed between the third and fourth layers,
the semiconductor member is interposed between the first and second fine-wall-shape members,
the first and second layers are made of GaN,
the third, fourth, and fifth layers and the semiconductor member are made of $In_xGa_{1-x}N$ (0<x<1),
a value x of the fifth layer is larger than values x of the third and fourth layers and the semiconductor member,
the fifth layer is a layer that generates light and guides the light,
the third and fourth layers are layers that guide the light generated in the fifth layer, and
the first and second layers are layers that suppress leakage of the light generated in the fifth layer.

2. The light-emitting device according to claim 1, wherein the semiconductor member is formed on the opposite side of the first fine-wall-shape member to the second fine-wall-shape member and the opposite side of the second fine-wall-shape member to the first fine-wall-shape member.

3. The light-emitting device according to claim 1, further comprising a sixth layer formed to cover an emitting surface for emitting the light generated in the fifth layer,
wherein the sixth layer is a layer that suppresses reflection of the light generated in the fifth layer,
a difference of an effective refractive index between the first fine-wall-shape member and the semiconductor member is equal to or smaller than 0.01, and
a difference of an effective refractive index between the second fine-wall-shape member and the semiconductor member is equal to or smaller than 0.01.

4. The light-emitting device according to claim 3, wherein an effective refractive index of the first fine-wall-shape member is equal to that of the semiconductor member, and
an effective refractive index of the second fine-wall-shape member is equal to that of the semiconductor member.

5. The light-emitting device according to claim 1, wherein a value x of the fifth layer is equal to or larger than 0.4 and equal to or smaller than 0.6.

6. The light-emitting device according to claim 1, wherein the semiconductor body has a third surface connecting the first and second surfaces and a fourth surface connecting the first and second surfaces and facing the third surface,
apart of the semiconductor body configures a waveguide, and
the waveguide is arranged to intersect with the first and second fine-wall-shape members and extend from the third surface to the fourth surface as seen in a plan view from a normal direction of the first surface.

7. The light-emitting device according to claim 1, further comprising:
a first electrode electrically connected to the first layer;
a second electrode electrically connected to the second layer, and
a seventh layer formed between the second layer and the second electrode,
wherein the semiconductor body has a third surface connecting the first and second surfaces and a fourth surface connecting to the first and second surfaces and facing the third surface,
the seventh layer makes ohmic contact with the second electrode, and
a contact surface between the seventh layer and the second electrode is arranged to intersect with the first and second fine-wall-shape members and extend from the third surface to the fourth surface as seen in a plan view from a normal direction of the first surface.

8. The light-emitting device according to claim 1, wherein the third layer is doped with a first conductivity type, the fourth layer is doped with a second conductivity type, and the semiconductor member is undoped.

9. A projector comprising:
the light-emitting device according to claim 1;
an optical modulator that modulates the light output from the light-emitting device based on image information; and
a projection device that projects an image formed by the optical modulator.

10. A light-emitting device comprising:
a first layer having a first surface;
a second layer having a second surface that faces the first surface; and
a semiconductor body interposed between the first and second surfaces,
wherein the semiconductor body has a first fine-wall-shape member, a second fine-wall-shape member, and a semiconductor member,
the first and second fine-wall-shape members having
a third layer adjacent to the first surface,
a fourth layer adjacent to the second surface, and
a fifth layer interposed between the third and fourth layers,
the semiconductor member is interposed between the first and second fine-wall-shape members,
the first and second layers are made of AlGaN,
the third and fourth layers are made of GaN,
the fifth layer and the semiconductor member are made of $In_xGa_{1-x}N$ (0<x<1), a value x of the fifth layer is larger than a value x of the semiconductor member,
the fifth layer is a layer that generates light and guides the light,
the third and fourth layers are layers that guide the light generated in the fifth layer, and
the first and second layers are layers that suppress leakage of the light generated in the fifth layer.

11. The light-emitting device according to claim 10, wherein the semiconductor member is formed on the opposite side of the first fine-wall-shape member to the second fine-wall-shape member and the opposite side of the second fine-wall-shape member to the first fine-wall-shape member.

12. The light-emitting device according to claim 10, further comprising a sixth layer formed to cover an emitting surface for emitting the light generated in the fifth layer,
wherein the sixth layer is a layer that suppresses reflection of the light generated in the fifth layer,
a difference of an effective refractive index between the first fine-wall-shape member and the semiconductor member is equal to or smaller than 0.01, and
a difference of an effective refractive index between the second fine-wall-shape member and the semiconductor member is equal to or smaller than 0.01.

13. The light-emitting device according to claim 12, wherein an effective refractive index of the first fine-wall-shape member is equal to that of the semiconductor member, and
an effective refractive index of the second fine-wall-shape member is equal to that of the semiconductor member.

14. The light-emitting device according to claim 10, wherein a value x of the fifth layer is equal to or larger than 0.4 and equal to or smaller than 0.6.

15. The light-emitting device according to claim 10, wherein the semiconductor body has a third surface connecting the first and second surfaces and a fourth surface connecting the first and second surfaces and facing the third surface,
a part of the semiconductor body configures a waveguide, and
the waveguide is arranged to intersect with the first and second fine-wall-shape members and extend from the third surface to the fourth surface as seen in a plan view from a normal direction of the first surface.

16. The light-emitting device according to claim 10, further comprising:
a first electrode electrically connected to the first layer;
a second electrode electrically connected to the second layer, and
a seventh layer formed between the second layer and the second electrode,
wherein the semiconductor body has a third surface connecting the first and second surfaces and a fourth surface connecting to the first and second surfaces and facing the third surface,
the seventh layer makes ohmic contact with the second electrode, and
a contact surface between the seventh layer and the second electrode is arranged to intersect with the first and second fine-wall-shape members and extend from the third surface to the fourth surface as seen in a plan view from a normal direction of the first surface.

17. The light-emitting device according to claim 10, wherein the third layer is doped with a first conductivity type, the fourth layer is doped with a second conductivity type, and the semiconductor member is undoped.

18. A projector comprising:
the light-emitting device according to claim 10;

an optical modulator that modulates the light output from the light-emitting device based on image information; and a projection device that projects an image formed by the optical modulator.

19. A light-emitting device comprising:

a first layer;

a plurality of wall-shaped members that has a longitudinal shape elongated in an in-plane direction of the first layer and is arranged on the first layer in a direction perpendicular to a longitudinal direction of the longitudinal shape;

a semiconductor member that is made of $In_xGa_{1-x}N$ ($0<x<1$) and provided between a plurality of the wall-shaped members; and a second layer disposed on a plurality of the wall-shaped members and the semiconductor member, wherein the wall-shaped member is obtained by sequentially stacking a first guiding layer, a light-emitting layer, and a second guiding layer in a direction normal to an in-plane direction of the first layer, the light-emitting layer is a layer that is made of $In_yGa_{1-y}N$ ($0<x<y<1$) and generates light, the first and second guiding layers are layers that guide the light generated in the light-emitting layer, and the first and second layers are layers that suppress leakage of the light generated in the light-emitting layer.

20. A projector comprising:

the light-emitting device according to claim 19;

an optical modulator that modulates the light output from the light-emitting device based on image information; and a projection device that projects an image formed by the optical modulator.

* * * * *